(12) United States Patent
Choi

(10) Patent No.: US 9,559,152 B2
(45) Date of Patent: Jan. 31, 2017

(54) DISPLAY DEVICE WITH A TOUCH DEVICE

(75) Inventor: Howon Choi, Daegu (KR)

(73) Assignee: LG Display Co., Ltd., Seoul (KR)

( * ) Notice: Subject to any disclaimer, the term of this patent is extended or adjusted under 35 U.S.C. 154(b) by 362 days.

(21) Appl. No.: 12/840,948

(22) Filed: Jul. 21, 2010

(65) Prior Publication Data

US 2011/0128240 A1 Jun. 2, 2011

(30) Foreign Application Priority Data

Dec. 1, 2009 (KR) .................. 10-2009-0117710

(51) Int. Cl.
| | |
|---|---|
| *G06F 3/041* | (2006.01) |
| *H01L 27/32* | (2006.01) |
| *G02F 1/13* | (2006.01) |
| *G02F 1/1333* | (2006.01) |
| *G06F 3/044* | (2006.01) |

(52) U.S. Cl.
CPC ............... *H01L 27/323* (2013.01); *G02F 1/13* (2013.01); *G02F 1/13338* (2013.01); *G06F 3/044* (2013.01); *G06F 3/0412* (2013.01); *G06F 2203/04111* (2013.01)

(58) Field of Classification Search
CPC ... G06F 3/041; G06F 2203/04111; G09G 3/36
USPC ........................................................ 345/173
See application file for complete search history.

(56) References Cited

U.S. PATENT DOCUMENTS

| | | | | |
|---|---|---|---|---|
| 7,924,272 | B2 * | 4/2011 | Boer | ..................... G06F 3/0412 |
| | | | | 178/18.09 |
| 8,052,498 | B2 * | 11/2011 | Chien et al. | .................... 445/24 |
| 2010/0007616 | A1 * | 1/2010 | Jang | ...................... G06F 3/0412 |
| | | | | 345/173 |
| 2010/0182272 | A1 * | 7/2010 | Kang | ...................... G06F 3/044 |
| | | | | 345/174 |
| 2010/0309150 | A1 * | 12/2010 | Lee et al. | ...................... 345/173 |

FOREIGN PATENT DOCUMENTS

| | | |
|---|---|---|
| CN | 101424817 A | 5/2009 |
| KR | 10-2008-0089910 | 10/2008 |
| KR | 10-2009-0111783 | 10/2009 |
| TW | 200944874 A | 11/2009 |

* cited by examiner

*Primary Examiner* — Nicholas Lee
*Assistant Examiner* — Duane N Taylor, Jr.
(74) *Attorney, Agent, or Firm* — Dentons US LLP

(57) ABSTRACT

A display device with a touch device comprises a substrate, a first bridge electrode positioned on the substrate, a plurality of insulating layer patterns covering both ends and a central portion of the first bridge electrode, a plurality of first electrodes separately positioned on the substrate comprising the insulating layer patterns, and connected to the first bridge electrode, a second bridge electrode positioned on the insulating layer patterns covering the central portion of the first bridge electrode, and crossing the first bridge electrode, and a plurality of second electrodes positioned to be separated from the first electrode on the substrate and integrally connected with the second bridge electrode.

22 Claims, 17 Drawing Sheets

DISPLAY DEVICE WITH A TOUCH DEVICE

This application claims the benefit of Korean Patent Application No. 10-2009-0117710 filed on Dec. 1, 2009 which is hereby incorporated by reference for all purposes.

BACKGROUND

Field of the Invention

This invention relates to a display device and, more particularly, to a display device with a touch device.

Related Art

As information technology is advancing, the market of a display device, a medium connecting users and information, is expanding. Accordingly, the use of a flat panel display (FPD) such as a liquid crystal display (LCD), an organic light emitting diode (OLED), a plasma display panel (PDP), and the like, is increasing.

Some of the display device may be driven by transistors formed in a matrix form on a substrate to display an image. The transistors may include a gate, a semiconductor layer, a source, and a drain, respectively.

Meanwhile, display device are employed for various purposes from a home appliance sector such as television (TV) or video to an industrial field such as a computer or the like. In addition, recently, research on adding a touch function by including a touch device in a display device is actively ongoing.

SUMMARY

Exemplary embodiments of the invention provide a display device with a touch device capable of improving transmittance and lowering contact resistance.

In one aspect, there is a display device with a touch device comprises a substrate, a first bridge electrode positioned on the substrate, a plurality of insulating layer patterns covering both ends and a central portion of the first bridge electrode, a plurality of first electrodes separately positioned on the substrate comprising the insulating layer patterns, and connected to the first bridge electrode, a second bridge electrode positioned on the insulating layer patterns covering the central portion of the first bridge electrode, and crossing the first bridge electrode, and a plurality of second electrodes positioned to be separated from the first electrode on the substrate and integrally connected with the second bridge electrode.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION

Reference will now be made in detail embodiments of the invention examples of which are illustrated in the accompanying drawings.

Various exemplary embodiments of the present invention will now be described with reference to the accompanying drawings.

Figure 1:
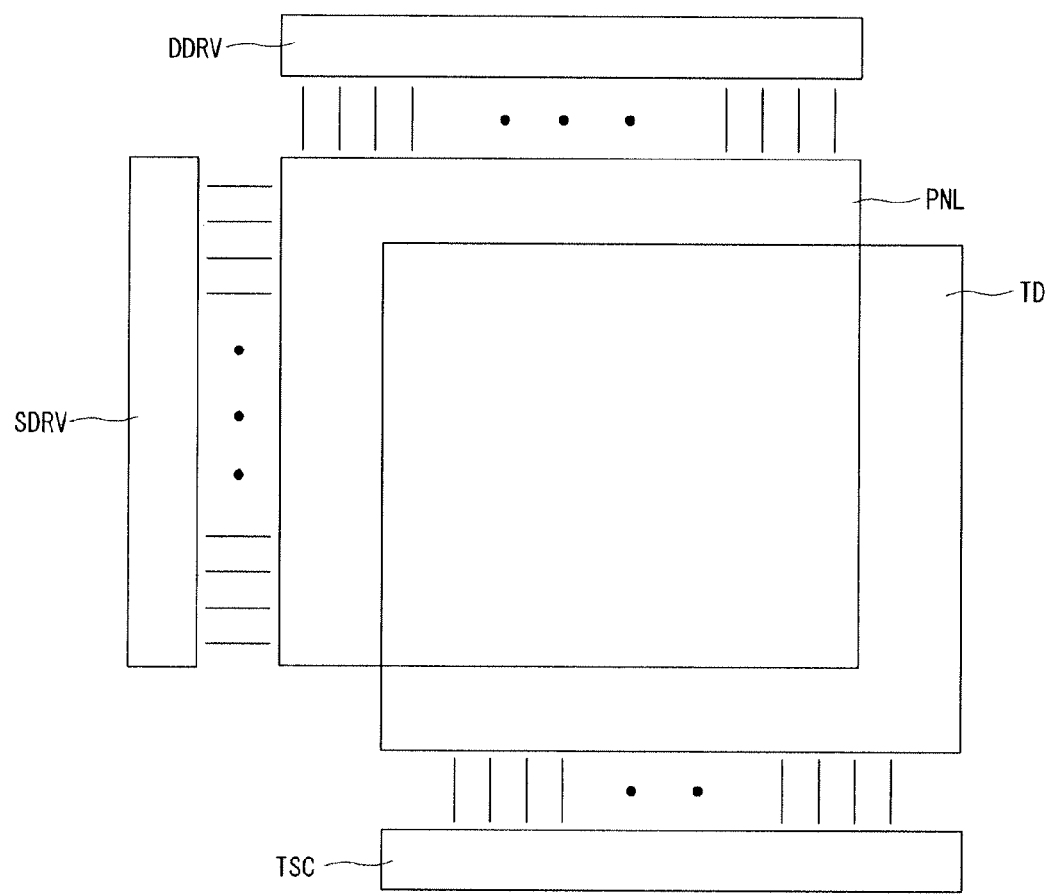
FIG. 1 illustrates a display device with a touch device according to an exemplary embodiment of the present invention.

FIG. 1 illustrates a display device with a touch device according to an exemplary embodiment of the present invention.

With reference to FIG. 1, the display device comprises a panel PNL, a touch device TD, a scan driving unit SDRV, a data driving unit DDRV, and a detection unit TSC.

The panel PNL may be configured as a flat panel display (FPD) such as an organic light emitting display panel, a liquid crystal display panel, a plasma display panel, and the like, and in the present exemplary embodiment, the panel PNL is configured as, for example, an organic light emitting display panel. The scan driving unit SDRV supplies scan signals to subpixels included in the panel PNL. The data driving unit DDRV supplies data signals to the subpixels included in the panel PNL. The touch device TD is positioned on the panel PNL and comprises an electrode part. The detection unit TSC is connected to the electrode part and detects a position through the electrode part according to a user's touch applied to the touch device TD. The detection unit TSC may be divided into a capacitive type detection unit using a change in capacitance (i.e., a change in capacitance according to a dielectric constant) and a resistive type detection unit using a change in resistance depending on the structure of the electrode part formed on the touch device TD.

Figure 2:
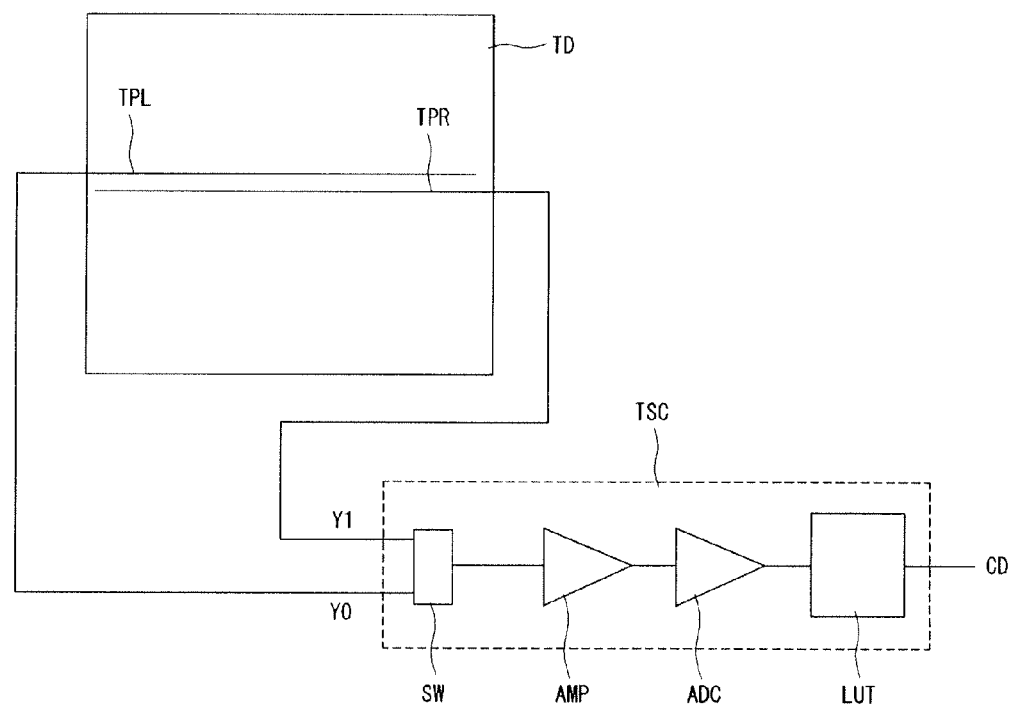
FIG. 2 is a schematic block diagram for explaining a capacitive type detection unit.

FIG. 2 is a schematic block diagram for explaining the capacitive type detection unit.

With reference to FIG. 2, the capacitive type detection unit TSC is connected to the electrode parts TPL and TPR positioned within the touch device TD. When a user touches the touch device TD, the detection unit TSC recognizes a change in the capacitance of the electrode parts TPL and TPR positioned within the touch device TD to detect a touched position.

For example, the detection unit TSC may comprise a signal input unit SW, a signal amplifying unit AMP, a signal conversion unit ADC and a signal detection unit LUT, but not limited thereto. The signal input unit SW receives signals through wirings Y0 and Y1 connected to the electrode parts TPL and TPR positioned within the touch device TD. The signal amplifying unit AMP amplifies the signals which have been transferred to the signal input unit SW. The signal conversion unit ADC converts an input analog signal into a digital signal. The signal detection unit LUT recognizes a change in capacitance of an area which has been touched by the user based on the converted digital signal to thus detect position data, and transfers the detected position data to a device (e.g., CD) that is to use the detected position data.

As above-mentioned, the detection unit TSC can detect a touched position upon recognition of a change in the capacitance of the electrode parts TPL and TPR positioned within the touch device TD, and in this case, the electrode parts TPL and TPR may have the following structure.

Figure 3:
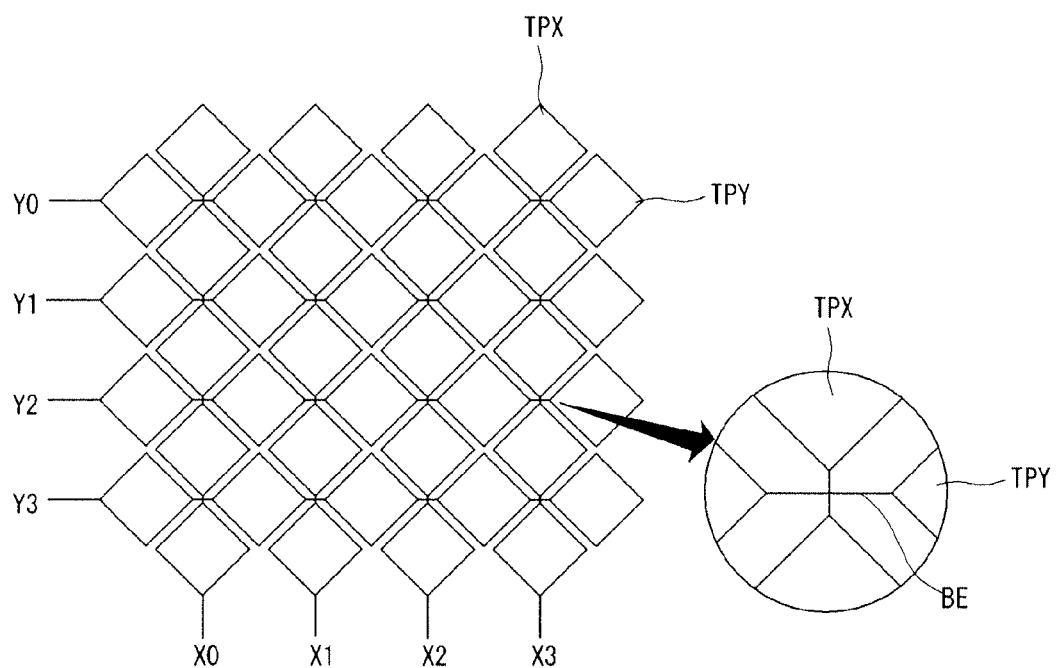
FIG. 3 illustrates the structure of an electrode part positioned within the touch device.

FIG. 3 illustrates the structure of an electrode part positioned within the touch device.

With reference to FIG. 3, the electrode parts TPL and TPR may comprise first electrodes TPY arranged in a Y axis direction of the touch device TD and second electrodes TPX arranged in an X axis direction of the touch device TD. The first electrodes TPY and the second electrodes TPX are patterned to be positioned at different areas, and the electrodes TPY and TPX may be connected by bridge electrodes BEs.

Figure 4:
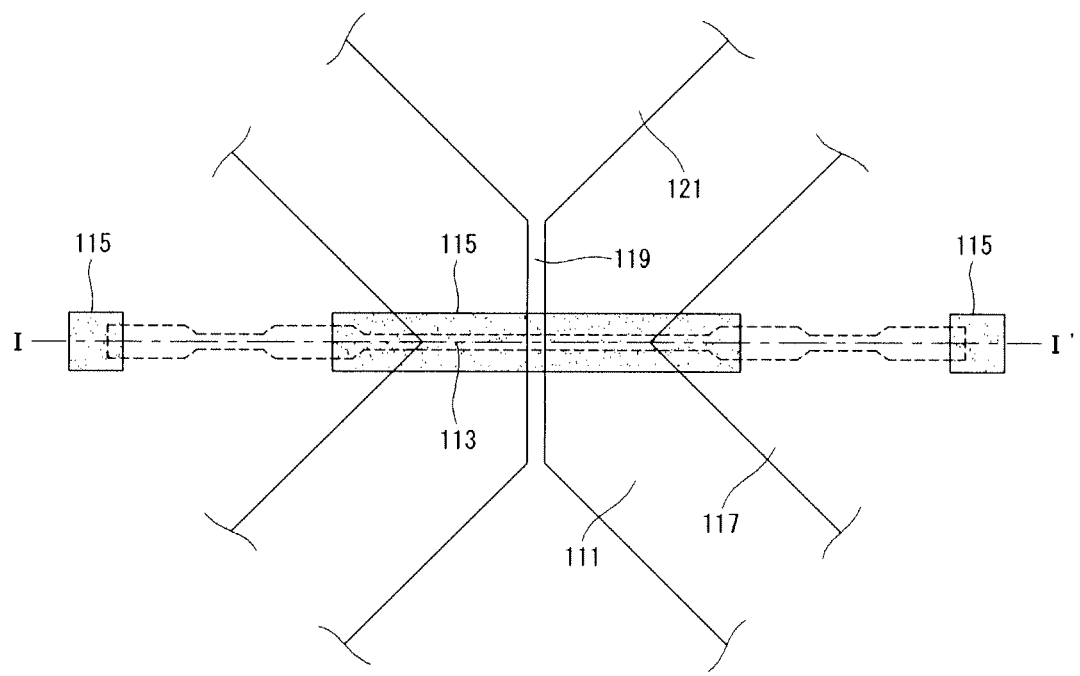
FIG. 4 illustrates an electrode part positioned within a touch device according to a first exemplary embodiment of the present invention.
Figure 5:
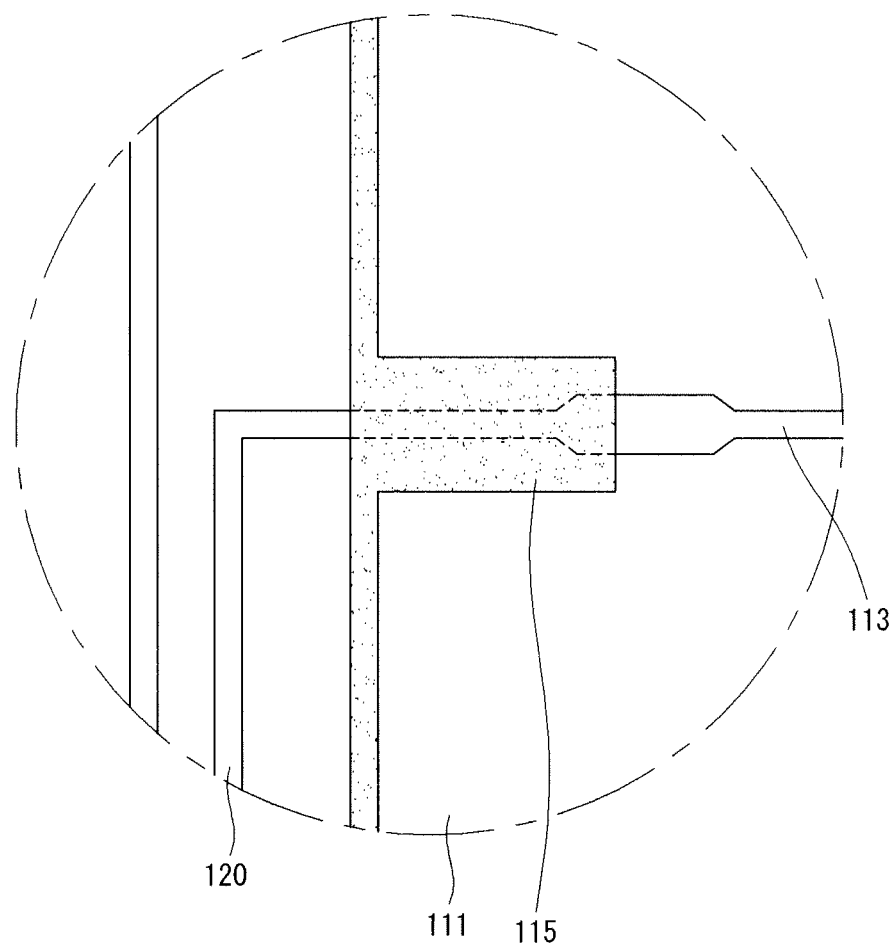
FIG. 5 illustrates the edge of the touch device.
Figure 6:
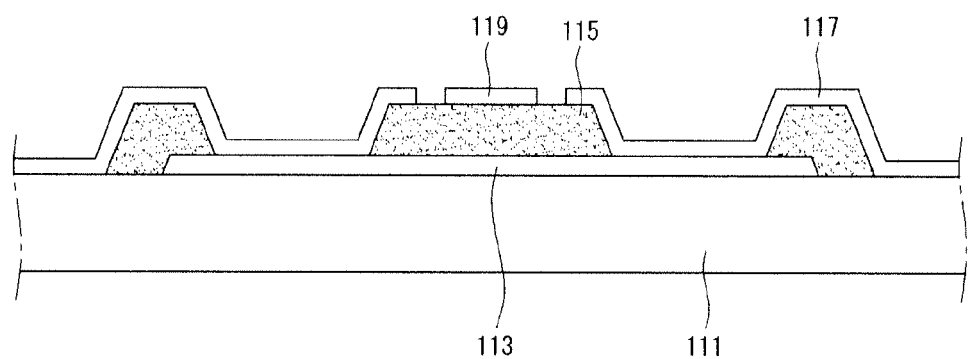
FIG. 6 is a cross-sectional view taken along line I-I' in FIG. 4.

FIG. 4 illustrates an electrode part positioned within a touch device according to a first exemplary embodiment of the present invention. FIG. 5 illustrates the edge of the touch device. FIG. 6 is a cross-sectional view taken along line I-I' in FIG. 4.

With reference to FIG. 4, first electrodes 117 may be arranged to be separated from each other in the Y axis direction on a substrate 111. The first electrodes 117 may be electrically connected via a first bridge electrode 113. A portion of the first bridge electrode 113 is exposed through an insulating layer pattern 115 formed on a partial area of the first bridge electrode 113, and the first electrodes 117 may be connected to the exposed first electrode 113. A second bridge electrode 119 may be positioned to vertically cross between the first electrodes 117. The second bridge electrode 119 may electrically connect second electrodes 121 arranged to be separated from each other in the X axis direction, and may be positioned to vertically cross the insulating layer pattern 115 and the first bridge electrode 113 positioned between the foregoing first electrodes 117. The second electrodes 121 may be positioned to be separated from the first electrodes 117 and may be integrally connected with the second bridge electrode 119.

Meanwhile, with reference to FIG. 5, a first routing electrode 120 connected to the first electrode 117 may be positioned at the edge of the substrate 111. The first routing electrode 120 may serve to inform the detection unit about a change in the capacitance of the electrode parts caused by a user's touch. The insulating layer pattern 115 may be positioned on a portion of the first routing electrode 120, and the first electrodes 117 may be positioned to cover the insulating layer pattern 115 and may be in contact with a portion of the routing electrode 120. The first electrodes 117 may be arranged in the Y axis direction. Thus, as the first routing electrode 120 informs the detection unit about a change in the capacitance of the first electrodes caused by a user's touch, the touch device can detect the touch.

The structure of the electrode parts of the touch device will now be described in detail with reference to FIG. 6. The first bridge electrode 113 may be positioned in the Y axis direction on the substrate 111. The Insulating layer pattern 115 may be positioned to cover both ends and a central portion of the bridge electrode 113. The first electrodes 117 may be positioned on the insulating layer pattern 115 so as to be connected with the first bridge electrode 113, respectively. The second bridge electrode 119 connecting the second electrodes arranged in the X axis direction may be positioned on the insulating layer pattern 115 formed on the central portion of the first bridge electrode 113. Here, the second bridge electrode 119 may be integrally formed with the second electrodes. The second bridge electrode 119 may be positioned on the same insulating layer pattern 115 on which the first electrodes 117 are formed, and in this case, as the second bridge electrode 119 and the first electrodes 117 are patterned through different processes, they may be positioned to be separated from each other.

In the first exemplary embodiment of the present invention, because the insulating layer pattern is formed only on a portion of the first bridge electrode 113 and on the edge of the substrate unlike the related art in which an insulating layer is formed on the entire surface of a substrate, transmittance of the display device can be improved. Also, a contact area between the first bridge electrode 113 and the first electrodes 117 can be enlarged to lower resistance.

In addition, because the routing electrode connected to the first electrode is positioned due to the insulating layer pattern exposing a portion of the first electrode at the edge of the substrate, an extra area to be reserved for a contact structure of the routing electrode and the first electrode likewise as in the related art can be omitted, thus advantageously reducing a bezel.

Figure 7:
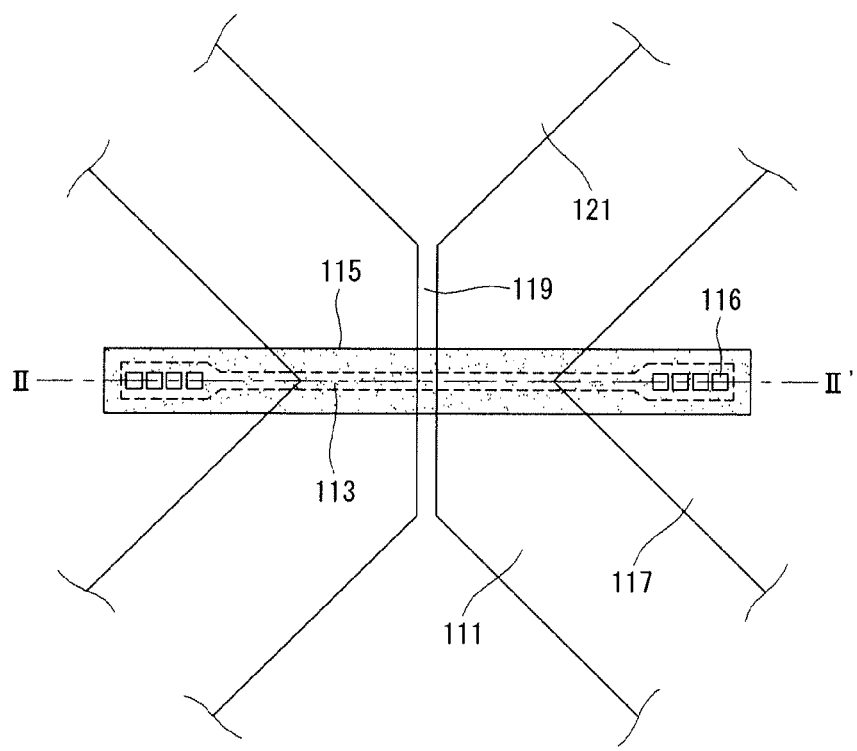
FIG. 7 illustrates an electrode part positioned within a touch device according to a second exemplary embodiment of the present invention.
Figure 8:
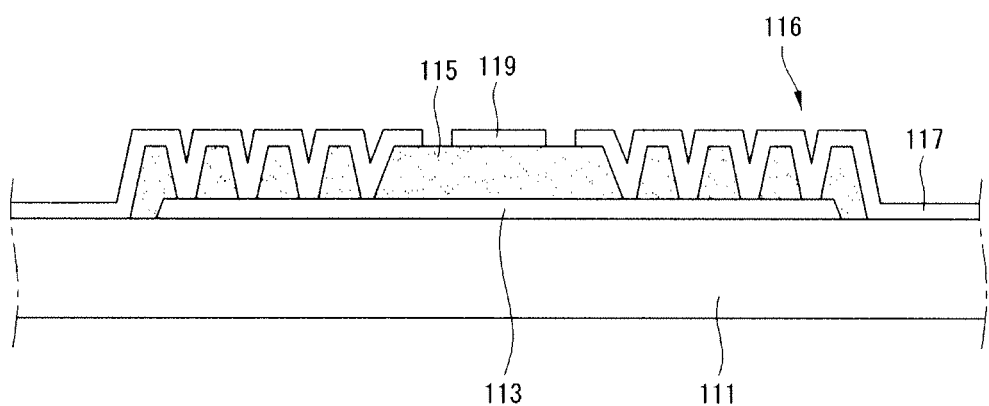
FIG. 8 is a cross-sectional view taken along line II-II' in FIG. 7.

FIG. 7 illustrates an electrode part positioned within a touch device according to a second exemplary embodiment of the present invention. FIG. 8 is a cross-sectional view taken along line II-II' in FIG. 7. In the second exemplary embodiment, the same reference numerals are used for the same elements as those in the first exemplary embodiment of the present invention and a description thereof will be made briefly.

With reference to FIG. 7, the first electrodes 117 may be arranged to be separated from each other in the Y axis direction on the substrate 111. The first electrodes 117 may be electrically connected to each other through the first bridge electrode 113. The insulating layer pattern 115 formed on a partial area of the first bridge electrode 113 comprises a plurality of contact holes 116, and portions of the first bridge electrode 113 may be exposed through the plurality of contact holes 116. The first electrodes 117 may be connected to the exposed first electrode 113, respectively. The second bridge electrode 119 may be positioned to vertically cross between the first electrodes 117. The second bridge electrode 119 may electrically connect the second electrodes 121 arranged to be separated from each other in the X axis direction, and may be positioned to vertically cross the insulating layer pattern 115 and the first bridge electrode 113 positioned between the foregoing first electrodes 117. The second electrodes 121 may be positioned to be separated from the first electrodes 117, may be connected to each other through the second bridge electrode 119, and may be integrally connected with the second bridge electrode 119.

The structure of the electrode parts of the touch device will now be described in detail with reference to FIG. 8. The first bridge electrode 113 may be positioned in the Y axis direction on the substrate 111. The insulating layer pattern 115 comprising one or more contact holes 116 may be positioned on a partial area of the substrate 111 to cover the first bridge electrode 113 such that a portion of the first bridge electrode 113 is exposed. The first electrodes 117 are positioned on the insulating layer pattern 115 and connected with the first bridge electrode 113 through the contact holes 116, respectively. The second bridge electrode 119 may be positioned to be separated from the first electrodes 117 on the insulating layer pattern 115 and cross the first bridge electrode 113. The second bridge electrode 119 may be integrally connected with the second electrodes arranged in the X axis direction, to connect the second electrodes. Here, the second bridge electrode 119 may be integrally formed with the second electrodes. The second bridge electrode 119 may be positioned on the same insulating layer pattern 115 on which the first electrodes 117 are formed, and in this case, as the second bridge electrode 119 and the first electrodes 117 are patterned through different processes, they may be positioned to be separated from each other.

In the second exemplary embodiment of the present invention, because the insulating layer pattern is formed only on a portion of the first bridge electrode 113 unlike the related art in which an insulating layer is formed on the entire surface of a substrate, transmittance of the display device can be improved. Also, a contact area between the first bridge electrode 113 and the first electrodes 117 can be enlarged to lower resistance.

Figure 9:
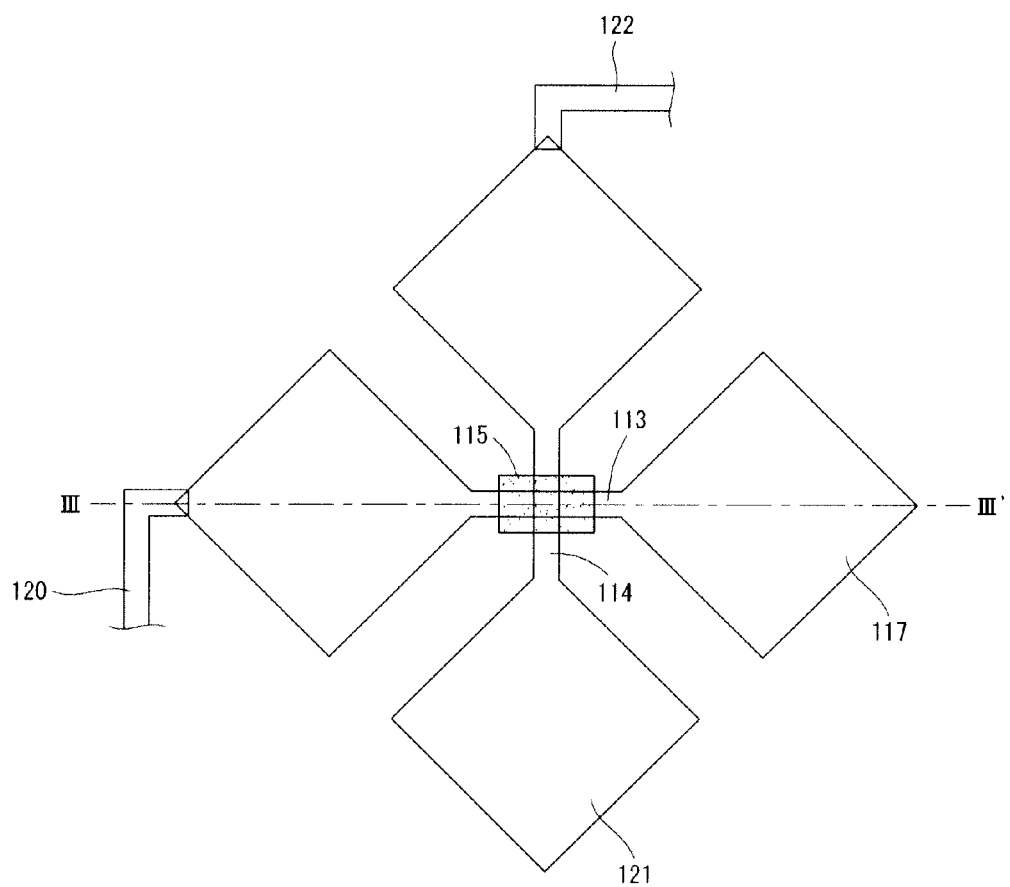
FIG. 9 illustrates an electrode part positioned within a touch device according to a third exemplary embodiment of the present invention.
Figure 10:
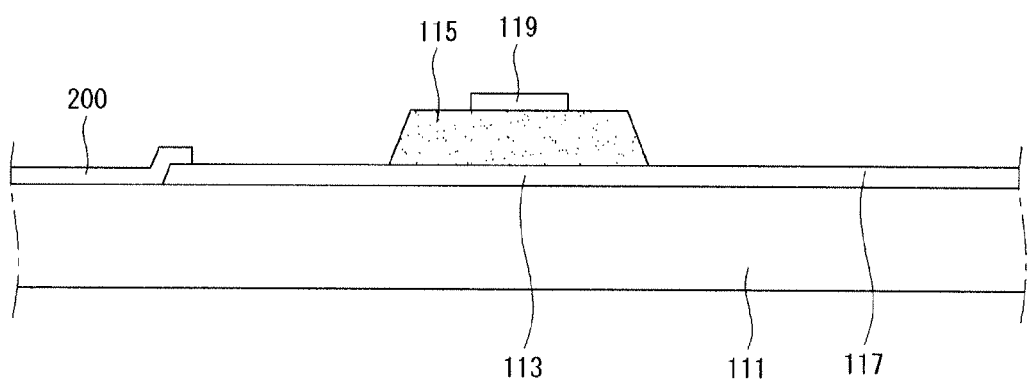
FIG. 10 is a cross-sectional view taken along line III-III' in FIG. 9.

FIG. 9 illustrates an electrode part positioned within a touch device according to a third exemplary embodiment of the present invention. FIG. 10 is a cross-sectional view taken along line III-III' in FIG. 9.

With reference to FIG. 9, the first electrodes 117 may be arranged to be separated from each other in the Y axis direction on the substrate 111. The first electrodes 117 may be electrically connected to each other through the first bridge electrode 113, and the first electrodes 117 and the first bridge electrode 113 may be integrally formed. The insulating layer pattern 115 may be positioned on a partial area of the first bridge electrode 113. The second bridge electrode 119 may be positioned to vertically cross between the first electrodes 117. The second bridge electrode 119 may electrically connect the second electrodes 121 which are arranged separately in the X axis direction and may be positioned to vertically cross the first bridge electrode 113. The second electrodes 121 may be positioned to be separated from the first electrodes 117 on the substrate 111, connected to each other through the second bridge electrode 119, and integrally connected with the second bridge electrode 119. The first routing electrode 120 may be connected to the end of the first electrodes arranged in the Y axis direction, and a second routing electrode 122 may be connected to the end of the second electrodes 121 arranged in the X axis direction.

The structure of the electrode parts of the touch device will now be described in detail with reference to FIGS. 9 and 10. The plurality of first electrodes 117 may be positioned on the substrate 111 such that they are connected to each other through the first bridge electrode 113 and integrally formed with the first bridge electrode 113. The insulating layer pattern 115 may be positioned at a central portion of the first bridge electrode 113. The second bridge electrode 119 may be positioned on the insulating layer pattern 115 such that the second bridge electrode 119 is separated from the first electrode 117 and crosses the first bridge electrode 113. A routing electrode 200 may be directly connected to the end of the first electrode 117.

In the third exemplary embodiment of the present invention, because the insulating layer pattern is formed only on a portion of the first bridge electrode 113 unlike the related art in which an insulating layer is formed on the entire surface of a substrate, transmittance of the display device can be improved. Also, because the first routing electrode is positioned to be connected to the first electrode at the edge of the substrate and the second routing electrode is positioned to be connected to the second electrode at the edge of the substrate, an extra area to be reserved for a contact structure of the routing electrodes and the electrodes likewise as in the related art can be omitted, thus advantageously reducing a bezel.

Various examples of the display device with a touch device according to the first to third exemplary embodiments of the present invention as stated above will now be described. In the following description, a touch device will be briefly explained, and the touch device may be those touch devices according to the first to third exemplary embodiments of the present invention as described above.

Figure 11:
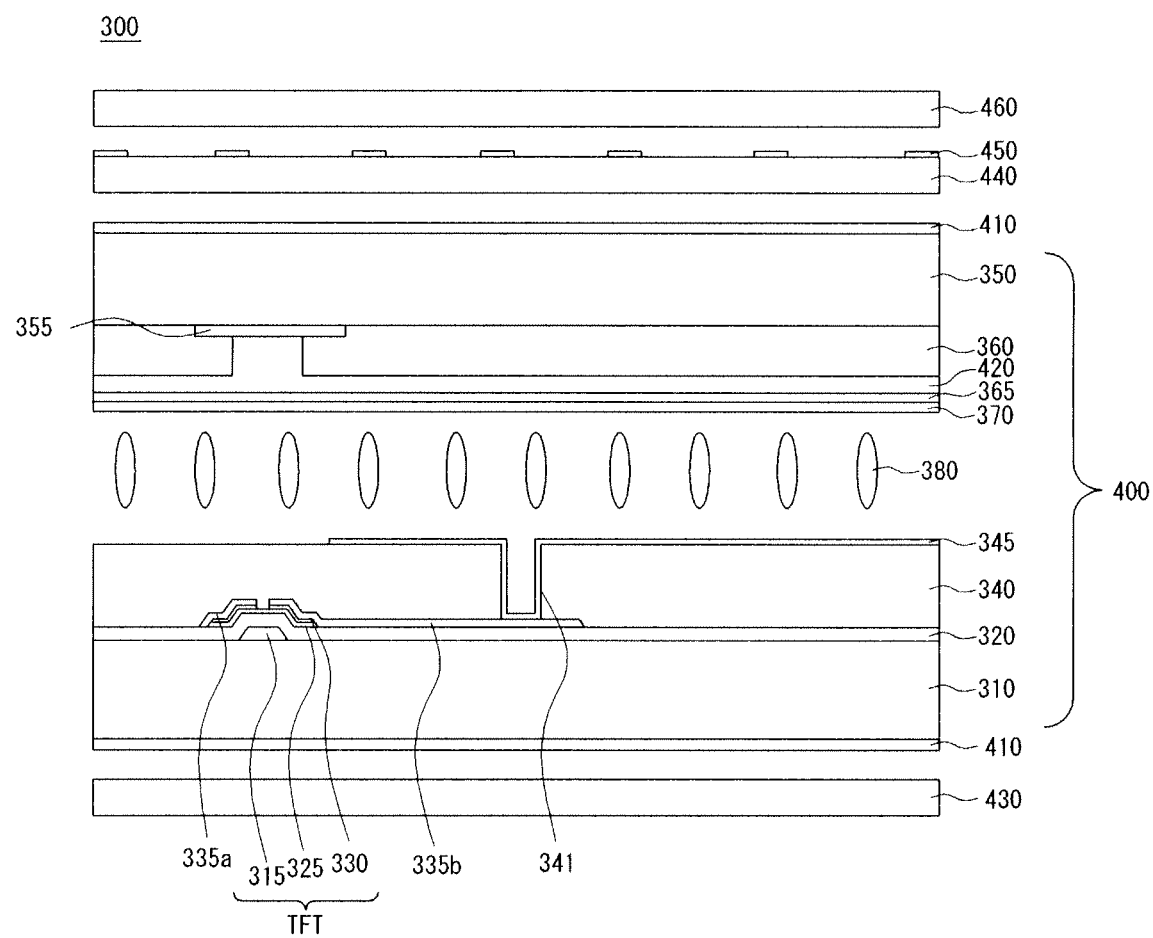
FIG. 11 illustrates a display device with a touch device according to a fourth exemplary embodiment of the present invention.
Figure 12:
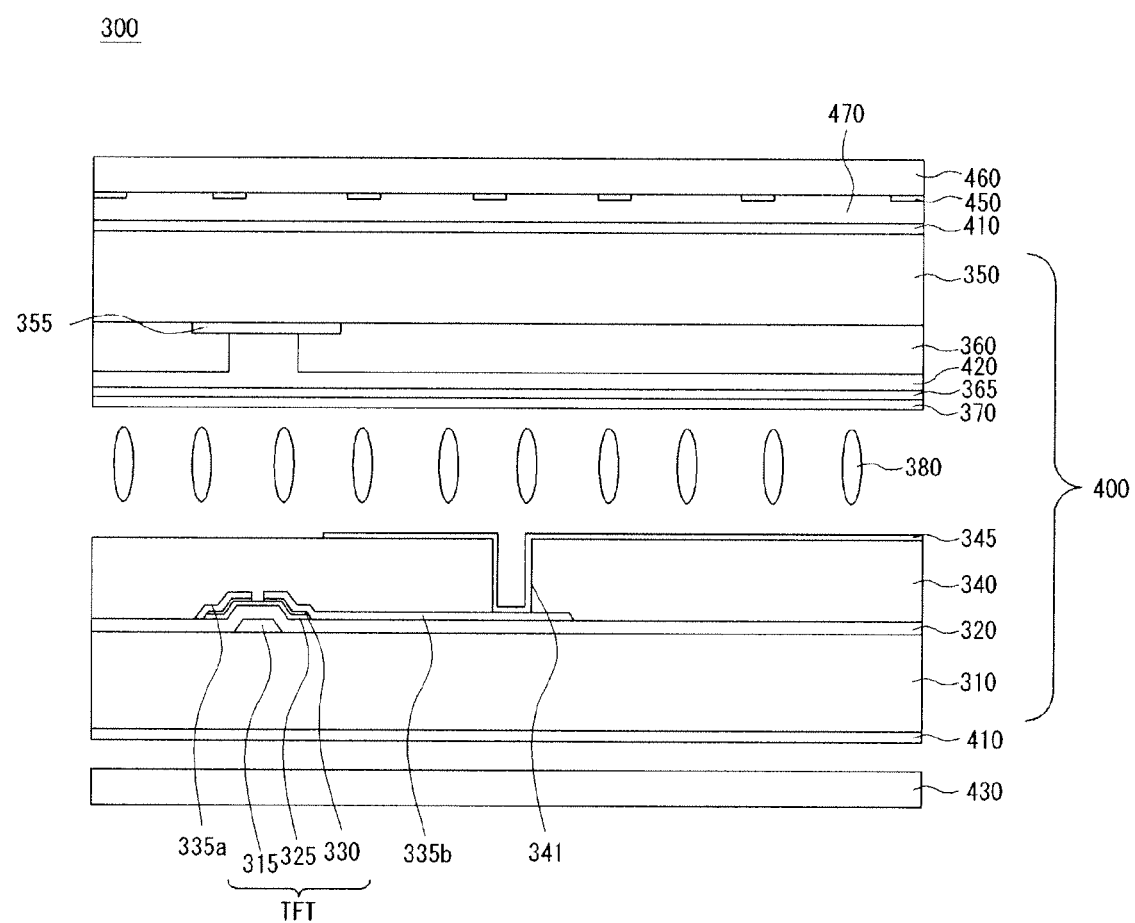
FIG. 12 illustrates a display device with a touch device according to a fifth exemplary embodiment of the present invention.
Figure 13:
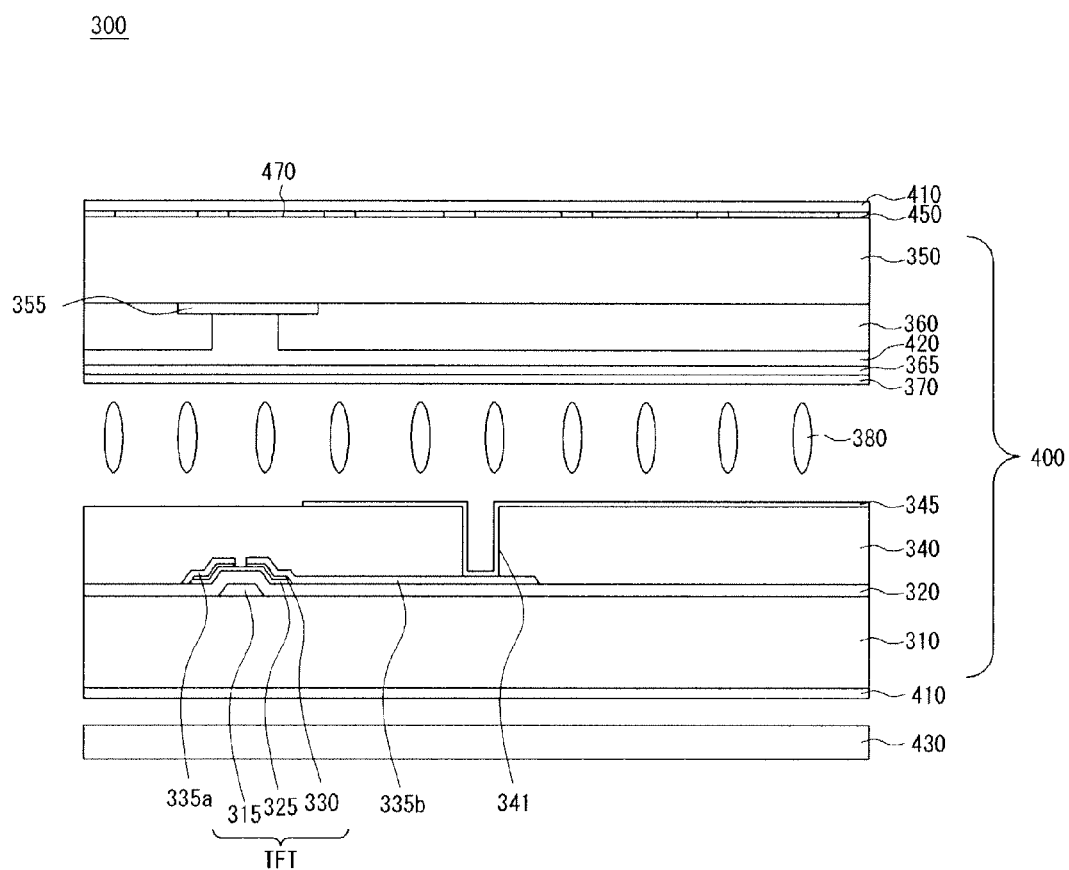
FIG. 13 illustrates a display device with a touch device according to a sixth exemplary embodiment of the present invention.
Figure 14:
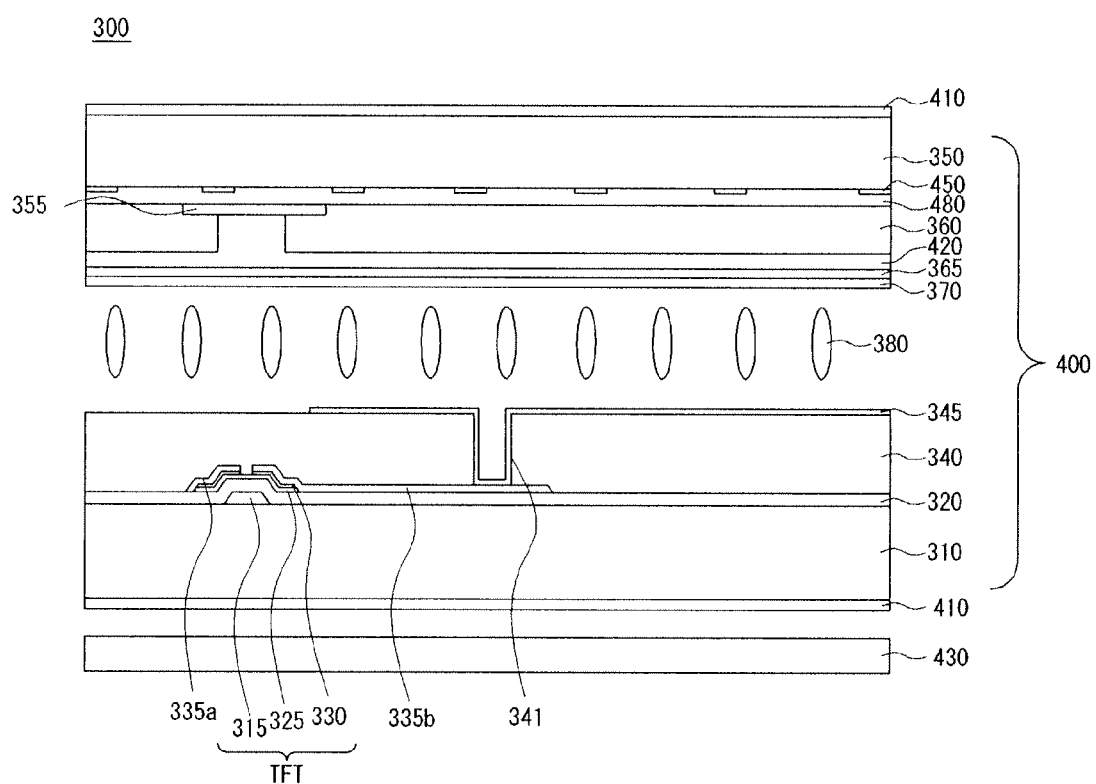
FIG. 14 illustrates a display device with a touch device according to a seventh exemplary embodiment of the present invention.

FIG. 11 illustrates a display device with a touch device according to a fourth exemplary embodiment of the present invention. FIG. 12 illustrates a display device with a touch device according to a fifth exemplary embodiment of the present invention. FIG. 13 illustrates a display device with a touch device according to a sixth exemplary embodiment of the present invention. FIG. 14 illustrates a display device with a touch device according to a seventh exemplary embodiment of the present invention.

With reference to FIG. 11, a display device 300 according to the fourth exemplary embodiment of the present invention may comprise a thin film transistor (TFT) array substrate 310, a color filter substrate 350 attached to the TFT array substrate 310 in a facing manner, and a liquid crystal layer 380 formed between the TFT array substrate 310 and the color filter substrate 350.

The TFT array substrate 310 may comprise a TFT formed on the TFT array substrate 310, a pixel electrode 345, and an organic insulating layer 340 formed between the TFT and the pixel electrode 345.

The TFT may comprise a gate electrode 315 connected to a gate line, a source electrode 335*a* connected to a data line, a drain electrode 335*b* formed to face the source electrode 335*a* and electrically connected to the pixel electrode 345, a gate insulating layer 320 insulating the gate electrode 315, and an active layer 325 and an ohmic-contact layer 330 formed at an area corresponding to the gate electrode 315 with the gate insulating layer 320 interposed therebetween.

The pixel electrode 345 is electrically connected to the drain electrode 335b via a contact hole 341 penetrating the organic insulating layer 340.

The color filter substrate 350 may comprise a black matrix 355, a color filter 360, an overcoat layer 365 covering the black matrix 335 and the color filter 360, and a common electrode 370 formed on the overcoat layer 365. Polarizers 410 may be formed on an upper portion of the color filter substrate 350 and on a lower portion of the TFT array substrate 310. Namely, the liquid crystal display panel 400 may comprise the TFT array substrate 310, the color filter substrate 350, and the liquid crystal layer 380 interposed between the TFT array substrate 310 and the color filter substrate 350.

A backlight unit 430 including a light source may be positioned at a lower side of the liquid crystal display panel 400. The backlight unit 430, which supplies light to the liquid crystal display panel 400, may be a light emitting diode (LED) or an organic light emitting diode (OLED) and may supply white or blue color.

A touch device 450 may be positioned on a substrate 440. The substrate 440 may be a transparent glass substrate, and the touch device 450 may employ the structures according to the first to third exemplary embodiments of the present invention as described above. A tempered glass substrate 460 may be positioned on the substrate 440 in order to protect the liquid crystal display panel 400 and the touch device 450. Accordingly, the display device may be provided as an add-on type display device in which the touch device 450 is positioned separately at an upper side of the liquid crystal display panel 400.

With reference to FIG. 12, unlike the fourth exemplary embodiment of the present invention as described above, the display device 300 with a touch device according to the fifth exemplary embodiment of the present invention is configured such that the touch device 450 is provided on a tempered glass substrate 460 positioned on the liquid crystal display panel 400. The tempered glass substrate 450 with the touch device 450 formed thereon may be attached to the liquid crystal display panel 400 by means of a transparent filler 470. Here, the transparent filler 470 may be, for example, a highly transparent adhesive or a highly transparent resin, but not limited thereto. Accordingly, the display device may be provided as a modified add-on type display device in which the touch device 450 is formed on the tempered glass substrate 460 and thusly attached to the liquid crystal display panel so as to be positioned.

With reference to FIG. 13, unlike the fourth and fifth exemplary embodiments of the present invention as described above, the display device 300 with a touch device according to the sixth exemplary embodiment of the present invention is configured such that the touch device 450 is provided on an outer surface of the color filter substrate 350 of the liquid crystal display panel 400. The transparent filler 470 may be formed on the color filter substrate 350 with the touch device 450 provided thereon, and the polarizer 410 may be attached thereto. Accordingly, the display device may be provided as an on-cell cap type display device in which the touch device 450 is directly formed on the color filter substrate 350 of the liquid crystal display panel 400.

With reference to FIG. 14, unlike the fourth to sixth exemplary embodiments of the present invention as described above, the display device 300 with a touch device according to the seventh exemplary embodiment of the present invention is configured such that the touch device 450 is provided between the color filter substrate 350 and the color filter 360. Namely, the touch device 450 is formed on the color filter substrate 350, an insulating layer 480 is formed on the touch device 450, and the black matrix 355 and the color filter 360 are formed on the insulating layer 480. Accordingly, the display device may be provided as an in-cell type display device in which the touch device 450 is positioned within the liquid crystal display panel 400.

Figure 15:
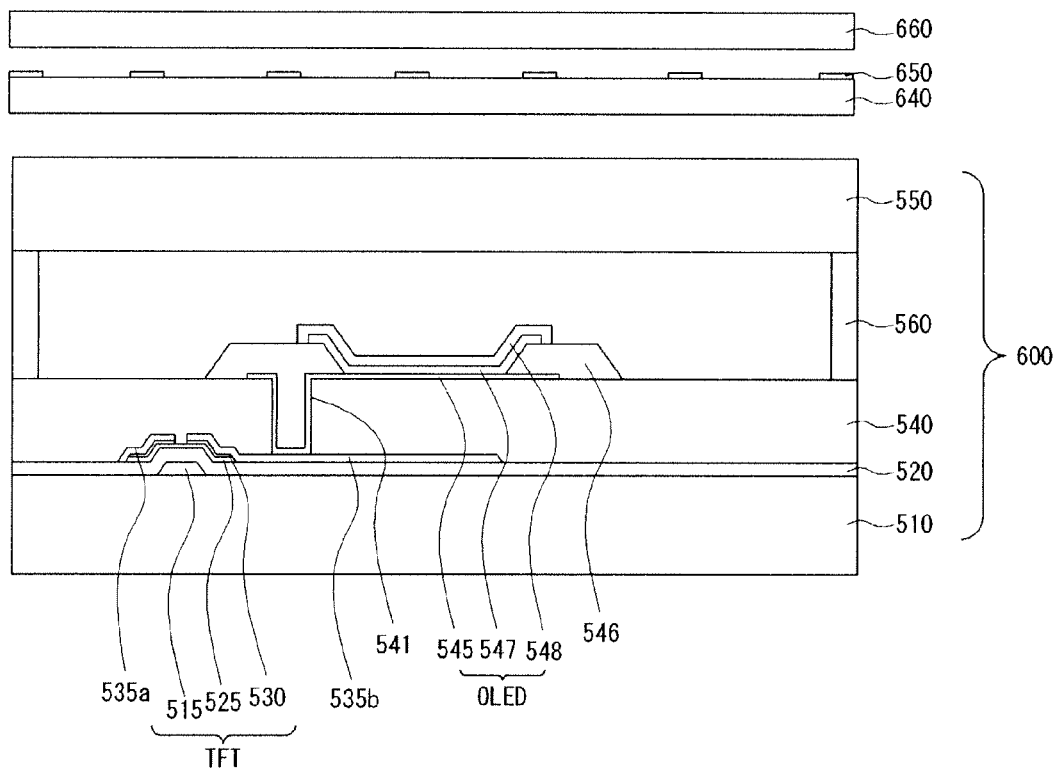
FIG. 15 illustrates a display device with a touch device according to an eighth exemplary embodiment of the present invention.
Figure 16:
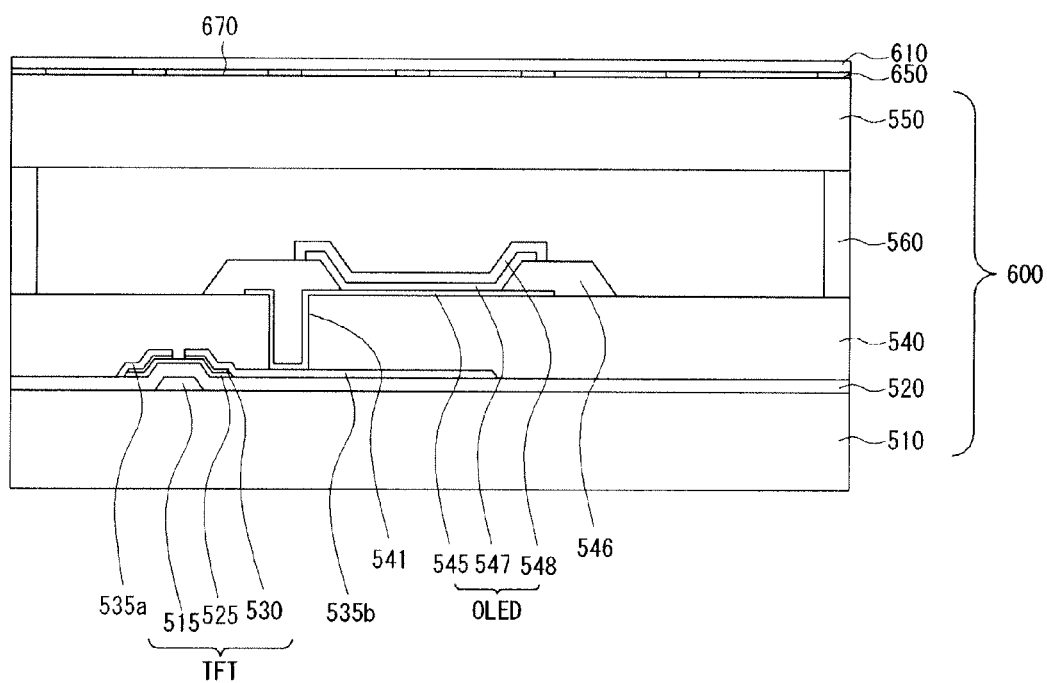
FIG. 16 illustrates a display device with a touch device according to an ninth exemplary embodiment of the present invention.
Figure 17:
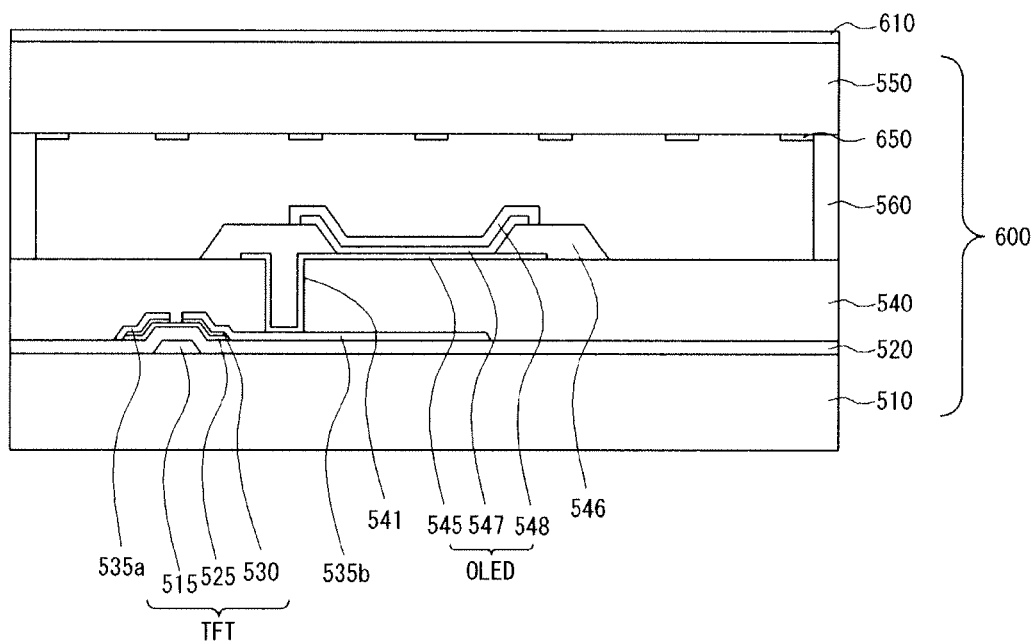
FIG. 17 illustrates a display device with a touch device according to a tenth exemplary embodiment of the present invention.

FIG. 15 illustrates a display device with a touch device according to an eighth exemplary embodiment of the present invention, FIG. 16 illustrates a display device with a touch device according to an ninth exemplary embodiment of the present invention, and FIG. 17 illustrates a display device with a touch device according to a tenth exemplary embodiment of the present invention.

With reference to FIG. 15, a display device 500 according to the eighth exemplary embodiment of the present invention may comprise an organic electroluminescence panel 600 comprising a TFT array substrate 510 and an encapsulation substrate 550 attached to the TFT array substrate 510 in a facing manner with a sealant 560.

The TFT array substrate 510 may comprise a TFT formed on the TFT array substrate and an organic light emitting diode (OLED) comprising a lower electrode 545 electrically connected to the TFT, an organic light emitting layer 547, and an upper electrode 548.

The TFT may comprise a gate electrode 515 connected to a gate line, a source electrode 535a connected to a data line, a drain electrode 535b formed to face the source electrode 535a and electrically connected to the lower electrode 545, a gate insulating layer 520 insulating the gate electrode 515, and an active layer 525 and an ohmic-contact layer 530 formed at an area corresponding to the gate electrode 515 with the gate insulating layer 520 interposed therebetween. The lower electrode 545 is electrically connected to the drain electrode 535b via a contact hole 541 penetrating the organic insulating layer 540.

The OLED may comprise the lower electrode 545, the organic light emitting layer 547, and the upper electrode 548. The lower electrode 545 may be selected as a cathode or an anode. When the lower electrode 545 is selected as a cathode, the cathode may be formed of one of aluminum (Al), an aluminum alloy (Al alloy), and AlNd, and not limited thereto. Also, when the lower electrode 545 is selected as a cathode, the cathode may be formed of a material having a high reflexibility.

A bank layer 546 having an opening exposing a portion of the lower electrode 545 is positioned on the lower electrode 545. The bank layer 546 may be formed of an organic substance such as benzocyclobutene (BCB)-based resin, an acrylic resin, or a polyimide resin, and the like, but not limited thereto.

The organic light emitting layer 547 is positioned on the lower electrode 545. The organic light emitting layer 547 may comprise a hole injection layer, a hole transport layer, a light emitting layer, an electron transport layer, and an electron injection layer. The upper electrode 548 is positioned on the organic light emitting layer 547. The upper electrode 548 may be selected as an anode or a cathode. Here, when the upper electrode 548 is selected as an anode, it may be formed of indium tin oxide (ITO), indium zinc oxide (IZO), indium tin zinc oxide (ITZO), and ZnO doped $Al_2O_3$ (AZO), but not limited thereto.

A touch device 650 formed on a substrate 640 may be positioned on the organic electroluminescence panel 600. The substrate 640 may be a transparent glass substrate, and the touch device 650 may employ the structures according to the first to third exemplary embodiments of the present invention. A tempered glass substrate 660 may be positioned on the substrate 640 in order to protect the organic electroluminescence panel 600 and the touch device 650. Accordingly, the display device may be provided as the add-type display device in which the touch device 650 is separately positioned at the upper side of the organic electroluminescence panel 600.

With reference to FIG. 16, unlike the eighth exemplary embodiment of the present invention as described above, the display device 500 with a touch device according to the ninth exemplary embodiment of the present invention is configured such that the touch device 650 is provided on an outer surface of the encapsulation substrate 550 of the organic electroluminescence panel 600. A transparent filler 670 may be formed on the encapsulation substrate 550 with the touch device 650 provided thereon, and a polarizer 610 may be attached thereto. Accordingly, the display device may be provided as the on-cell type display device in which the touch device 650 is directly formed on the encapsulation substrate 550 of the organic electroluminescence panel 600.

With reference to FIG. 17, unlike the eighth and ninth exemplary embodiments of the present invention as described above, the display device 500 with a touch device according to the tenth exemplary embodiment of the present invention is configured such that the touch device 650 is provided within the encapsulation substrate 550 of the organic electroluminescence panel 600. Accordingly, the display device may be provided as the in-cell type display device in which the touch device 650 is positioned within the organic electroluminescence panel 600.

Figure 18:
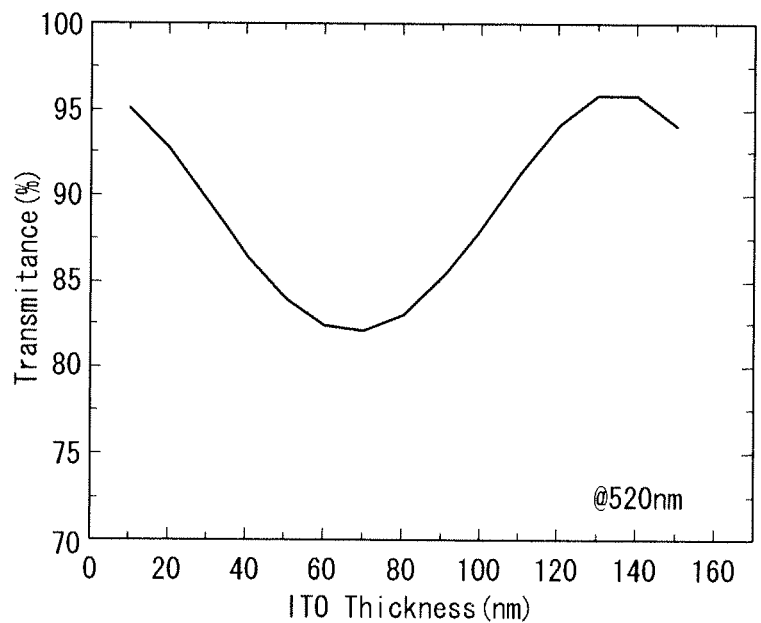
FIG. 18 is a graph of transmittance over thicknesses of first and second electrodes of the display device with a touch device manufactured according to the first exemplary embodiment of the present invention.
Figure 19:
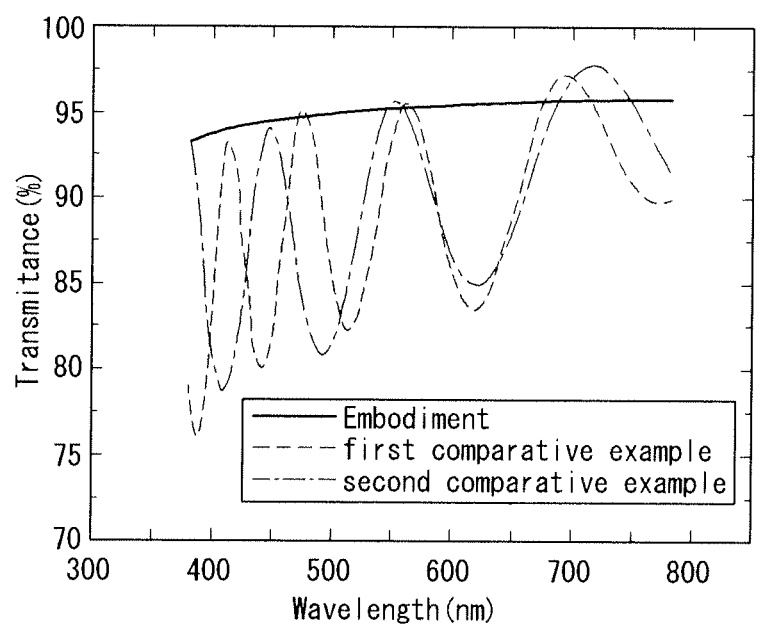
FIG. 19 is a graph of transmittance according to comparative examples and an exemplary embodiment of the present invention.

FIG. 18 is a graph of transmittance over thicknesses of first and second electrodes of the display device with a touch device manufactured according to the first exemplary embodiment of the present invention, and FIG. 19 is a graph of transmittance according to comparative examples and an exemplary embodiment of the present invention.

With reference to FIG. 18, the first and second electrodes of the touch device were formed with ITO with a thickness ranging from 10 nm to 150 nm and transmittance of the display device was measured. As noted in FIG. 18, when the thickness of ITO is 140 nm, nearly 96 percent of transmittance was obtained.

Based on such results, in an exemplary embodiment of the present invention, a display device was manufactured such that first and second electrodes were formed of ITO having a thickness of 140 nm, and an insulating layer pattern made of SiNx was formed only at a portion of a first bridge electrode connecting the first electrodes (See FIG. 4). In a first comparative example, a display device was manufactured such that an insulating layer made of SiNx was formed with a thickness of 610 nm on the entire surface of the substrate, and the ITO, the first and second electrodes, was formed with a thickness of 140 nm. In a second comparative example, a display device was manufactured such that an insulating layer made of SiNx was formed with a thickness of 510 nm on the entire surface of the substrate, and the ITO, the first and second electrodes, was formed with a thickness of 70 nm.

With reference to FIG. 19, it is noted that the display device manufactured according to the first and second comparative examples show a considerably severe deviation of transmittance by the wavelength ranges, while the display device manufactured according to an exemplary embodiment of the present invention exhibits good transmittance with little deviation of transmittance by wavelength ranges.

As described above, in the display device with a touch device according to the exemplary embodiments of the present invention, because the insulating layer pattern is formed only on a portion of the first bridge electrode and on the edge of the substrate, instead of the insulating layer positioned on the entire surface of the substrate as in the related art, the transmittance of the display device can be improved.

In addition, because the contact area between the first bridge electrode and the first electrode increases, resistance can be lowered. Also, because the routing electrode connected to the first electrode is positioned due to the insulating layer pattern exposing a portion of the first electrode at the edge of the substrate, an extra area to be reserved for a contact structure of the routing electrode and the first electrode likewise as in the related art can be omitted, thus advantageously reducing a bezel.

The foregoing embodiments and advantages are merely exemplary and are not to be construed as limiting the present invention. The present teaching can be readily applied to other types of devices. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. A display device with a touch device, the touch device comprising:
   a substrate;
   a first bridge electrode directly on the substrate;
   at least two insulating layer patterns at the first bridge electrode and separately covering both ends and a central portion of the first bridge electrode;
   a plurality of first electrodes on the substrate covering the insulating layer patterns at both ends of the first bridge electrode, and connected in at least one area between each of the both ends and the central portion of the first bridge electrode;
   a second bridge electrode on the insulating layer patterns covering the central portion of the first bridge electrode, and crossing the first bridge electrode; and
   a plurality of second electrodes separated from the first electrodes on the substrate,
   wherein the plurality of second electrodes is spaced from the at least two insulating layer patterns covering the central portion of the first bridge electrode,
   wherein the first electrode is on the insulating layer pattern at the central portion of the first bridge electrode, and
   wherein the second bridge electrode is extended from two of the plurality of second electrodes without overlapping the two second electrodes.

2. The display device with a touch device of claim 1, further comprising:
   a first routing electrode on the edge of the substrate and connected to the first electrodes; and
   a second routing electrode connected to the second electrodes.

3. The display device with a touch device of claim 1, further comprising:
   a backlight unit under the substrate;
   a liquid crystal display panel on the backlight unit and comprising a liquid crystal layer between a thin film transistor (TFT) array substrate and a color filter substrate; and
   a tempered glass substrate on the substrate.

4. The display device with a touch device of claim 1, further comprising:
an organic electroluminescence panel under the substrate, comprising a TFT array substrate with an organic light emitting diode comprising a lower electrode, a light emission layer, and an upper electrode, and an encapsulation substrate; and
a tempered glass substrate at upper portions of the substrates.

5. The display device with a touch device of claim 1, further comprising:
a backlight unit under the substrate;
a liquid crystal display panel on the backlight unit and comprising a TFT array substrate, a color filter substrate, and a liquid crystal layer between the TFT array substrate and the color filter substrate,
wherein the substrate is a tempered glass substrate, and the touch device on the substrate faces the liquid crystal display panel.

6. The display device with a touch device of claim 1, further comprising:
a liquid crystal display panel under the substrate and comprising a TFT array substrate, a color filter substrate, and a liquid crystal layer between the TFT array substrate and the color filter substrate; and
a polarizer on the substrate,
wherein the substrate is a color filter substrate.

7. The display device with a touch device of claim 1, further comprising:
an organic electroluminescence panel under the substrate and comprising a TFT array substrate comprising an organic light emitting diode comprising a lower electrode, a light emitting layer, and an upper electrode, and an encapsulation substrate; and
a polarizer on the substrate,
wherein the substrate is the encapsulation substrate.

8. The display device with a touch device of claim 1, wherein the substrate is a color filter substrate comprising a color filter formed on the touch device, a black matrix, and an overcoat layer covering the color filter and the black matrix.

9. The display device with a touch device of claim 1, further comprising:
a TFT array substrate comprising an organic light emitting diode comprising a lower electrode, a light emitting layer, and an upper electrode,
wherein the substrate is an encapsulation substrate attached to the TFT array substrate, and the touch device formed on the substrate faces the TFT array substrate.

10. A display device with a touch device, the touch device comprising:
a substrate;
a first bridge electrode directly on the substrate;
at least two insulating layer patterns at the first bridge electrode and separately covering a portion of the first bridge electrode, and comprising one or more contact holes exposing a portion of the first bridge electrode;
a plurality of first electrodes on the substrate covering the insulating layer patterns at both ends of the first bridge electrode, and connected in at least one area between each of the both ends and a central portion of the first bridge electrode via the contact holes;
a second bridge electrode separated from the first electrodes on the insulating layer pattern, and crossing the first bridge electrode; and
a plurality of second electrodes separated from the first electrodes on the substrate, connected to each other via the second bridge electrode,
wherein the plurality of second electrodes is spaced from the insulating layer pattern covering the central portion of the first bridge electrode,
wherein the first electrode is on the insulating layer at the central portion of the first bridge electrode, and
wherein the second bridge electrode is extended from two of the plurality of second electrodes without overlapping the two second electrodes.

11. The display device with a touch device of claim 10, further comprising:
a first routing electrode on the edge of the substrate and connected to the first electrodes; and
a second routing electrode connected to the second electrodes.

12. The display device with a touch device of claim 10, further comprising:
a backlight unit under the substrate;
a liquid crystal display panel on the backlight unit and comprising a liquid crystal layer between a thin film transistor (TFT) array substrate and a color filter substrate; and
a tempered glass substrate on the substrate.

13. The display device with a touch device of claim 10, further comprising:
an organic electroluminescence panel under the substrate, comprising a TFT array substrate with an organic light emitting diode comprising a lower electrode, a light emission layer, and an upper electrode, and an encapsulation substrate; and
a tempered glass substrate at upper portions of the substrates.

14. The display device with a touch device of claim 10, further comprising:
a backlight unit under the substrate;
a liquid crystal display panel on the backlight unit and comprising a TFT array substrate, a color filter substrate, and a liquid crystal layer interposed between the TFT array substrate and the color filter substrate,
wherein the substrate is a tempered glass substrate, and the touch device formed on the substrate faces the liquid crystal display panel.

15. The display device with a touch device of claim 10, further comprising:
a liquid crystal display panel under the substrate and comprising a TFT array substrate, a color filter substrate, and a liquid crystal layer interposed between the TFT array substrate and the color filter substrate; and
a polarizer positioned on the substrate,
wherein the substrate is a color filter substrate.

16. The display device with a touch device of claim 10, further comprising:
an organic electroluminescence panel under the substrate and comprising a TFT array substrate comprising an organic light emitting diode comprising a lower electrode, a light emitting layer, and an upper electrode, and an encapsulation substrate; and
a polarizer on the substrate,
wherein the substrate is the encapsulation substrate.

17. The display device with a touch device of claim 10, wherein the substrate is a color filter substrate comprising a color filter formed on the touch device, a black matrix, and an overcoat layer covering the color filter and the black matrix.

18. The display device with a touch device of claim 10, further comprising:
- a TFT array substrate comprising an organic light emitting diode comprising a lower electrode, a light emitting layer, and an upper electrode,
- wherein the substrate is an encapsulation substrate attached to the TFT array substrate, and the touch device formed on the substrate faces the TFT array substrate.

19. The display device with a touch device of claim 1, wherein the insulating layer patterns on the central portion of the first bridge electrode are spaced from the insulating layer patterns on both end portion of the first bridge electrode.

20. The display device with a touch device of claim 10, wherein the insulating layer patterns on the central portion of the first bridge electrode are spaced from the insulating layer patterns on both end portion of the first bridge electrode.

21. The display device with a touch device of claim 1, wherein the first electrode and the second electrode are on same layer.

22. The display device with a touch device of claim 10, wherein the first electrode and the second electrode are on same layer.

* * * * *